United States Patent
Chang et al.

(10) Patent No.: US 6,791,387 B1
(45) Date of Patent: Sep. 14, 2004

(54) FEEDBACK LATCH CIRCUIT AND METHOD THEREFOR

(75) Inventors: Tsin-Yuan Chang, Hsinchu (TW); Hao-Yung Lo, Hsinchu (TW); Shao-Sheng Yang, Kaohsiung (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 10/650,368

(22) Filed: Aug. 27, 2003

(30) Foreign Application Priority Data

Apr. 21, 2003 (TW) ........................................ 92109241 A

(51) Int. Cl.[7] .............................................. H03K 3/037
(52) U.S. Cl. ........................................ 327/225; 327/215
(58) Field of Search ................................ lp;1p327/199, 327/ 200, 201, 215–218, 225

(56) References Cited

U.S. PATENT DOCUMENTS 5,793,236 A * 8/1998 Kosco ........................ 327/218

* cited by examiner

*Primary Examiner*—Kenneth B. Wells
(74) *Attorney, Agent, or Firm*—Christensen O'Connor Johnson Kindness PLLC

(57) ABSTRACT

A feedback latch circuit includes a first logic OR gate for performing a logic OR operation upon a clock input signal and a latch output, a first logic AND gate for performing a logic AND operation upon output of the first logic OR gate and a data input signal, a second logic AND gate for performing a logic AND operation upon a complementary clock input signal and the latch output, and a second logic OR gate for performing a logic OR operation upon outputs of the first and second logic AND gates to result in the latch output that is provided to the first logic OR gate and the second logic AND gate. The complementary clock input signal received by the second logic AND gate complements the clock input signal received by the first logic OR gate.

5 Claims, 6 Drawing Sheets

|  | Present invention | Conventional D-latch | Conventional Earle latch | Jamb latch | transmission-gate latch | Tri-state buffer latch | Modified Svensson latch |
|---|---|---|---|---|---|---|---|
| Unit area | 14 | 18 | 18 | 6 | 10 | 10 | 7 |
| Total area | 36 | 72 | 54 | 36 | 48 | 48 | 39 |
| Delay (ns) | 0.274 | 0.284 | 0.313 | 0.262 | 0.255 | 0.396 | 0.209 |
| Power (mW) | 0.144 | 0.316 | 0.164 | 0.328 | 0.363 | 0.299 | 0.148 |

FEEDBACK LATCH CIRCUIT AND METHOD THEREFOR

CROSS-REFERENCE TO RELATED APPLICATION

This application claims priority of Taiwanese application No. 092109241, filed on Apr. 21, 2003.

BACKGROUND OF THE INVENTION

1. Field of the Invention

The invention relates to a latch circuit, more particularly to a feedback latch circuit and latch method based on a modified Earle latch circuit design.

2. Description of the Related Art

Rapid progress in semiconductor manufacturing technology has made it possible to replace large and complex printed circuit board (PCB) based systems with semiconductor chip based systems. Particularly, it is now possible to integrate microprocessors, memories, analog circuits and radio frequency circuits into a single silicon chip. The size of the chip area is a factor that has a big influence on cost computations. In the design of very large scale integrated circuit (VLSI) chips, in order to ensure accuracy of input and output signals in a Boolean clock logic circuit, a latch circuit is usually coupled between input and output terminals of the chips. Accordingly, input and output signals can be latched so that normal operation of the clock circuit can be ensured. The design of a simple and fast latch circuit is a critical issue since it can affect both circuit layout and operating time.

As shown in FIG. 1, a conventional NAND-type static D-latch 2 requires both a true data input signal (DATA) and a complementary data input signal (DATA') gated by a clock input signal (CLK). However, it is not easy to obtain the complementary data input signal (DATA') for the D-latch 2. Moreover, a three-level gate delay is incurred in the D-latch 2.

A conventional Earle latch circuit 3 is shown in FIG. 2. Unlike the D-latch 2 of FIG. 1, the Earle latch circuit 3 does not require a complementary data input signal (DATA'). Moreover, the complementary clock input signals (CLK, CLK') can be easily obtained for the Earle latch circuit 3. Furthermore, since there is only a two-level gate delay in the Earle latch circuit 3, the Earle latch circuit 3 is faster than the D-latch 2 of FIG. 1. When implemented in a two-level sum-of-product Boolean logic circuit, the Earle latch circuit 3 can reduce both delay and circuit area.

FIG. 3 illustrates a full-adder carry circuit 4 designed in accordance with the conventional Earle latch circuit 3. The carry circuit 4 of FIG. 3 requires three data inputs: a first addend (A), a second addend (B), and a carry (C). The logic equation of the carry circuit 4 is as follows:

Carry output (Cout)=$(A \cdot B + A \cdot C + B \cdot C) \cdot CLK + (A \cdot B + A \cdot C + B \cdot C) \cdot Cout + CLK' \cdot Cout$ where "+" stands for logic OR, and "·" stands for logic AND.

As evident from the foregoing, since the carry circuit 4 requires three data inputs (A, B, C), logic for the data inputs (A, B, C) must be duplicated for processing with the clock input signal (CLK) and the carry output (Cout), respectively. As a result, circuit area, power dissipation, and delay are inevitably increased.

SUMMARY OF THE INVENTION

Therefore, the object of the present invention is to provide a feedback latch circuit and latch method based on a modified Earle latch circuit design that can eliminate redundant logic in circuit applications to result in smaller circuit area, power dissipation and delay.

According to one aspect of the present invention, a feedback latch circuit comprises:

a first logic OR gate having a clock input terminal for receiving a clock input signal, a data input terminal, and an output terminal;

a first logic AND gate having a first data input terminal coupled to the output terminal of the first logic OR gate, a second data input terminal for receiving a data input signal, and an output terminal;

a second logic AND gate having a data input terminal coupled to the data input terminal of the first logic OR gate, a clock input terminal for receiving a complementary clock input signal that complements the clock input signal, and an output terminal; and a second logic OR gate having a first data input terminal coupled to the output terminal of the first logic AND gate, a second data input terminal coupled to the output terminal of the second logic AND gate, and an output terminal coupled to the data input terminals of the first logic OR gate and the second logic AND gate.

A latch output of the feedback latch circuit is obtained from the output terminal of the second logic OR gate.

According to another aspect of the present invention, a latch-incorporating circuit comprises:

a set of first logic OR gates, each of which has a clock input terminal for receiving a clock input signal, a data input terminal, and an output terminal;

a set of first logic AND gates, each of which has a first data input terminal coupled to the output terminal of a respective one of the first logic OR gates, a number of data input terminals, each of which receives a data input signal, and an output terminal;

a second logic AND gate having a data input terminal coupled to the data input terminal of each of the first logic OR gates, a clock input terminal for receiving a complementary clock input signal that complements the clock input signal, and an output terminal; and a second logic OR gate having a set of first data input terminals coupled respectively to the output terminals of the first logic AND gates, a second data input terminal coupled to the output terminal of the second logic AND gate, and an output terminal coupled to the data input terminals of the first logic OR gates and the second logic AND gate.

A data output signal of the latch-incorporating circuit is obtained from the output terminal of the second logic OR gate.

According to yet another aspect of the present invention, a latch-incorporating circuit comprises:

a first logic OR gate having a clock input terminal for receiving a clock input signal, a data input terminal, and an output terminal;

a set of first logic AND gates, each of which has a first data input terminal coupled to the output terminal of the first logic OR gate, a number of data input terminals, each of which receives a data input signal, and an output terminal;

a second logic AND gate having a data input terminal coupled to the data input terminal of the first logic OR gate, a clock input terminal for receiving a complementary clock input signal that complements the clock input signal, and an output terminal; and a second logic OR gate having a set of first data input terminals coupled respectively to the output terminals of the first logic AND gates, a second data input terminal coupled to the output terminal of the second logic AND gate, and an output terminal coupled to the data input terminals of the first logic OR gate and the second logic AND gate.

A data output signal of the latch-incorporating circuit is obtained from the output terminal of the second logic OR gate.

According to still another aspect of the present invention, a feedback latch circuit comprises:

a first logic OR gate for performing a logic OR operation upon a clock input signal and a latch output;

a first logic AND gate, coupled to the first logic OR gate, for performing a logic AND operation upon output of the first logic OR gate and a data input signal;

a second logic AND gate for performing a logic AND operation upon a complementary clock input signal and the latch output, the complementary clock input signal complementing the clock input signal; and a second logic OR gate, coupled to the first logic OR gate and the first and second logic AND gates, for performing a logic OR operation upon outputs of the first and second logic AND gates to result in the latch output that is provided to the first logic OR gate and the second logic AND gate.

According to a further aspect of the present invention, a latch method comprises:

performing a logic OR operation upon a clock input signal and a latch output to obtain a first logic OR output;

performing a logic AND operation upon the first logic OR output and a data input signal to obtain a first logic AND output;

performing a logic AND operation upon a complementary clock input signal and the latch output to obtain a second logic AND output, the complementary clock input signal complementing the clock input signal; and performing a logic OR operation upon the first and second logic AND outputs to result in the latch output.

BRIEF DESCRIPTION OF THE DRAWINGS

Other features and advantages of the present is invention will become apparent in the following detailed description of the preferred embodiment with reference to the accompanying drawings, of which:

FIGS. 7, 8 and 9 illustrate post-layout simulation waveforms to compare performance between full-adders based on the original Earle latch circuit and the feedback latch circuit of this invention, wherein FIG. 7 illustrates full-adder input waveforms, FIG. 8 illustrates full-adder carry output waveforms, and FIG. 9 illustrates full-adder sum output waveforms; and FIG. 10 is a table to illustrate a comparison among various static latches in a full-adder carry circuit.

DETAILED DESCRIPTION OF THE PREFERRED EMBODIMENT

Figure 1:
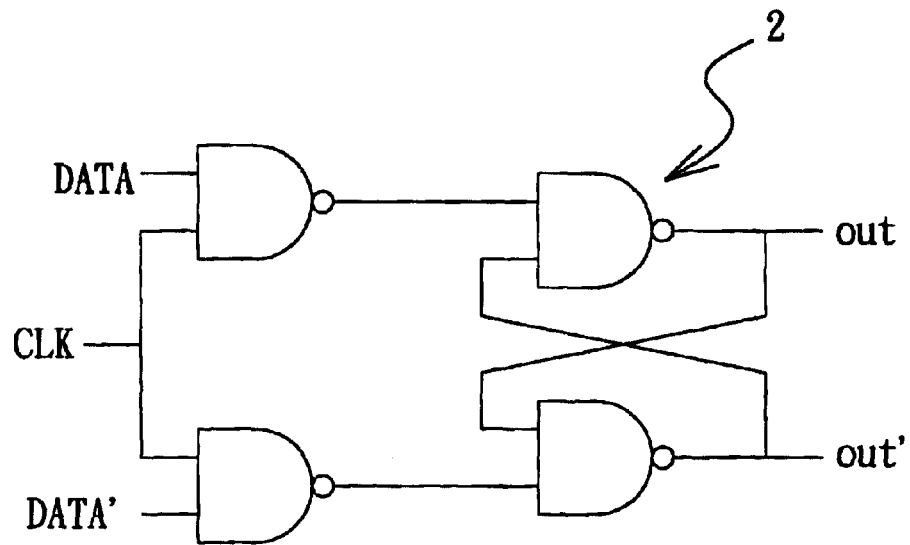
FIG. 1 is a schematic circuit diagram of a conventional NAND-type static D-latch.
Figure 2:
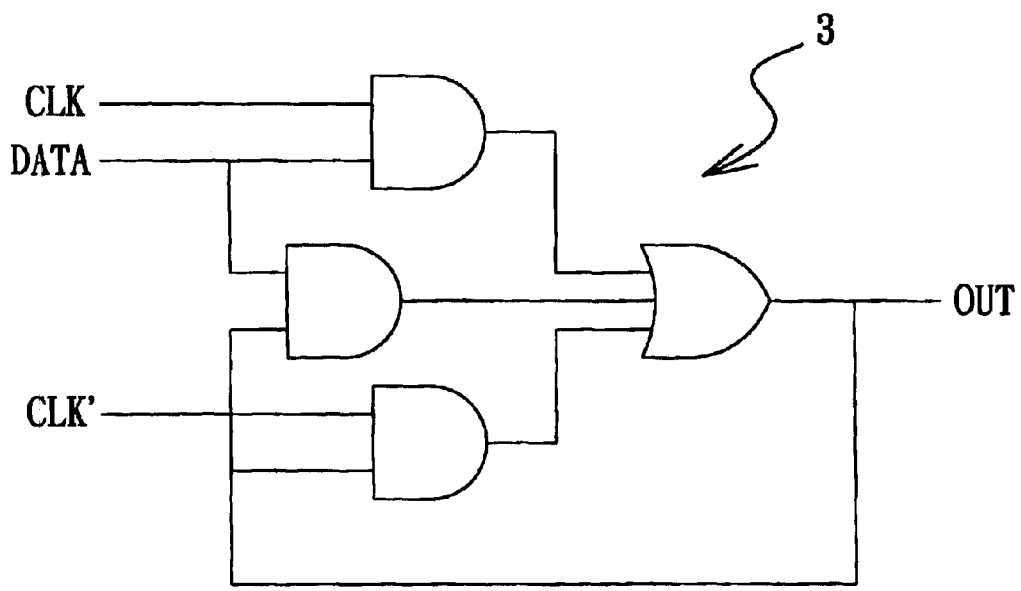
FIG. 2 is a schematic circuit diagram of a conventional Earle latch circuit.
Figure 3:
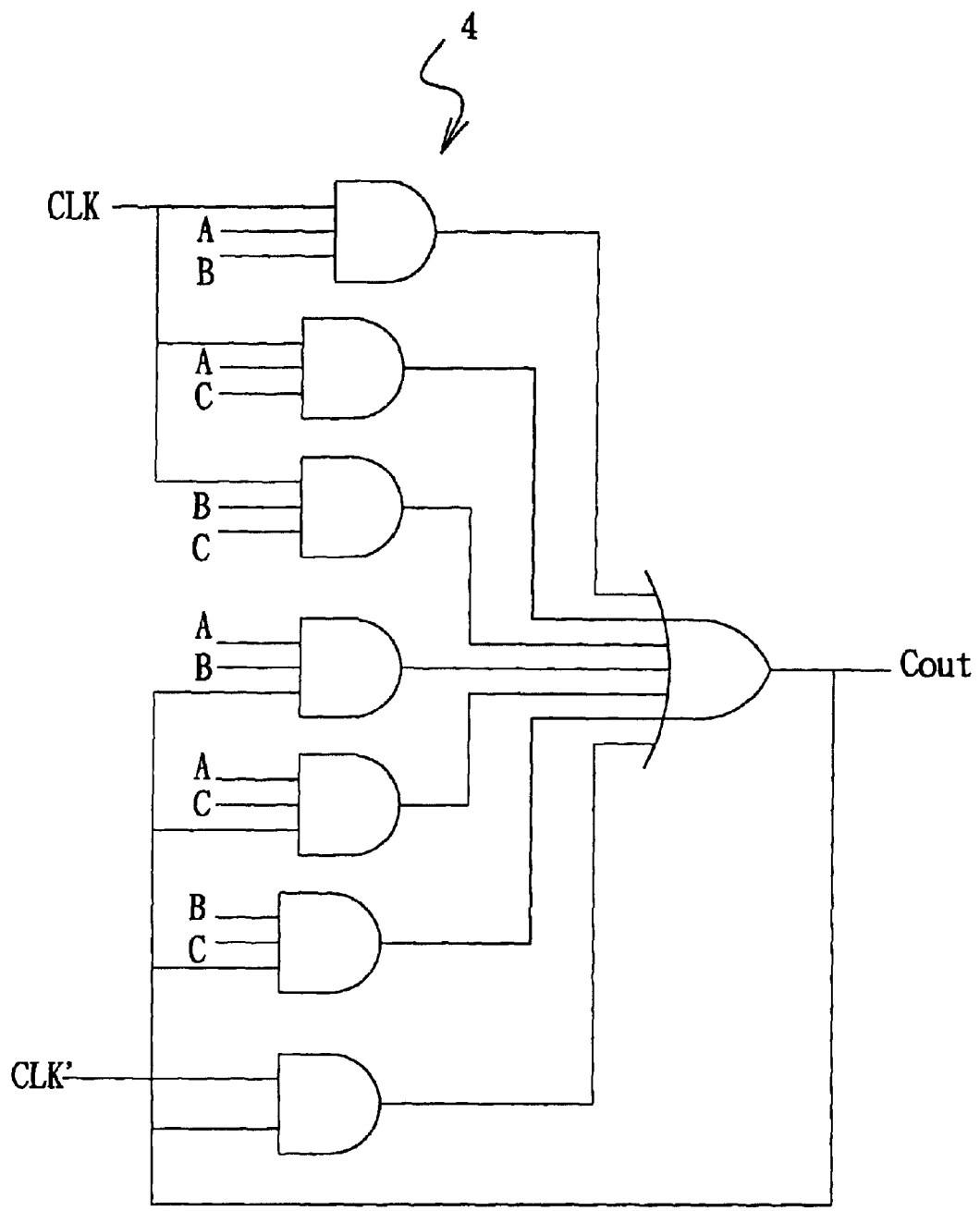
FIG. 3 is a schematic circuit diagram illustrating a circuit application of the conventional Earle latch circuit of FIG. 2.
Figure 4:
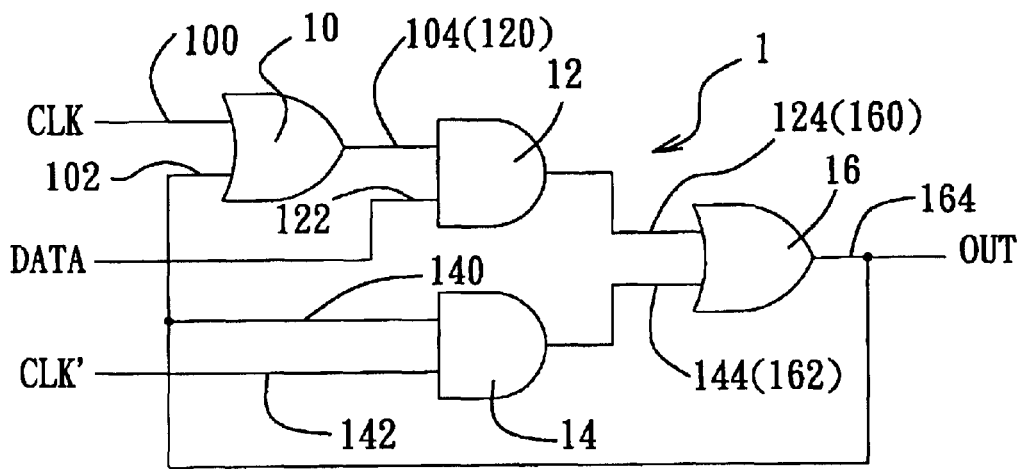
FIG. 4 is a schematic circuit diagram of the preferred embodiment of a feedback latch circuit according to this invention.

Referring to FIG. 4, the preferred embodiment of a feedback latch circuit 1 according to the present invention is shown to include a first logic OR gate 10, a first logic AND gate 12, a second logic AND gate 14, and a second logic OR gate 16.

The first logic OR gate 10 has a clock input terminal 100 for receiving a clock input signal (CLK), a data input terminal 102, and an output terminal 104.

The first logic AND gate 12 has a first data input terminal 120 coupled to the output terminal 104 of the first logic OR gate 10, a second data input terminal 122 for receiving a data input signal (DATA), and an output terminal 124.

The second logic AND gate 14 has a data input terminal 140 coupled to the data input terminal 102 of the first logic OR gate 10, a clock input terminal 142 for receiving a complementary clock input signal (CLK') that complements the clock input signal (CLK), and an output terminal 144.

The second logic OR gate 16 has a first data input terminal 160 coupled to the output terminal 124 of the first logic AND gate 12, a second data input terminal 162 coupled to the output terminal 144 of the second logic AND gate 14, and an output terminal 164 coupled to the data input terminals 102, 140 of the first logic OR gate 10 and the second logic AND gate 14.

A latch output (OUT) of the feedback latch circuit 1 is obtained from the output terminal 164 of the second logic OR gate 16.

The latch method of this embodiment is as follows:
a) The first logic OR gate 10 performs a logic OR operation upon the clock input signal (CLK) and the latch output (OUT) to obtain a first logic OR output.
b) The first logic AND gate 12 performs a logic AND operation upon the first logic OR output and the data input signal (DATA) to obtain a first logic AND output.
c) The second logic AND gate 14 performs a logic AND operation upon the complementary clock input signal (CLK') and the latch output (OUT) to obtain a second logic AND output.
d) The second logic OR gate 16 performs a logic OR operation upon the first and second logic AND outputs from the first and second logic AND gates 12, 14 to result in the latch output (OUT) that is provided to the first logic OR gate 10 and the second logic AND gate 14.

Figure 5:
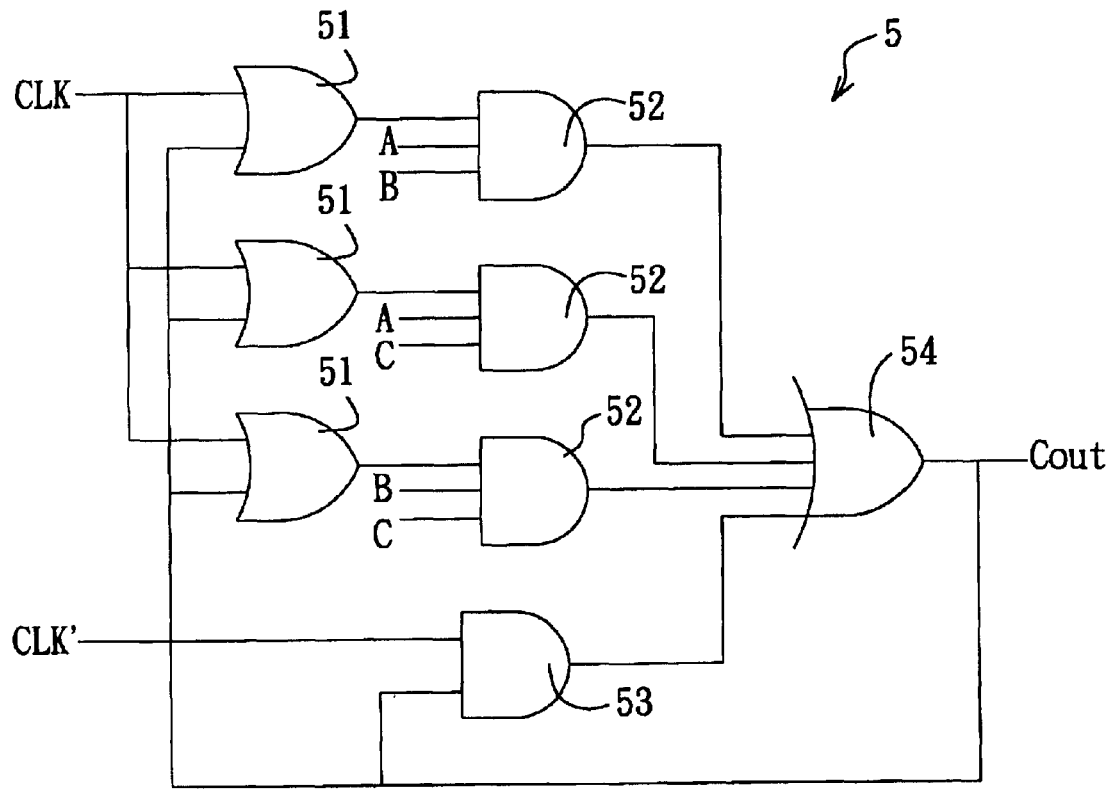
FIG. 5 is a schematic circuit diagram illustrating a circuit application of the feedback latch circuit of FIG. 4.

FIG. 5 illustrates a full-adder carry circuit 5 designed in accordance with the feedback latch circuit of this invention. The carry circuit 5 of FIG. 5 requires three data inputs: a first addend (A), a second addend (B), and a carry (C). The carry circuit 5 includes: a set of first logic OR gates 51, each of which has a clock input terminal for receiving a clock input signal (CLK), a data input terminal, and an output terminal; a set of first logic AND gates 52, each of which has a first data input terminal coupled to the output terminal of a respective one of the first logic OR gates 51, a pair of data input terminals, each of which receives a respective one of the data inputs (A, B, C), and an output terminal; a second logic AND gate 53 having a data input terminal coupled to the data input terminal of each of the first logic OR gates 51, a clock input terminal for receiving a complementary clock input signal (CLK') that complements the clock input signal (CLK), and an output terminal; and a second logic OR gate 54 having a set of first data input terminals coupled respectively to the output terminals of the first logic AND gates 52, a second data input terminal coupled to the output terminal of the second logic AND gate 53, and an output terminal coupled to the data input terminals of the first logic OR gates 51 and the second logic AND gate 53. A carry output (Cout) of the carry circuit 5 is obtained from the output terminal of the second logic OR gate 54. The logic equation of the carry circuit 5 is as follows:

Carry output (Cout)=$(A \cdot B + A \cdot C + B \cdot C) \cdot (CLK + Cout) + CLK' \cdot Cout$ where "+" stands for logic OR, and "·" stands for logic AND.

As compared to the conventional full-adder carry circuit based on the original Earle latch circuit design, logic operations for direct processing of the data inputs (A, B, C) with the clock input signal (CLK) and the carry output (Cout) are not required in the carry circuit 5 of FIG. 5. Instead, the first logic OR gates 51 perform a logic OR operation upon the clock input signal (CLK) and the carry output (Cout), and the first logic AND gates 52 perform a logic AND operation upon the output of the respective first logic OR gate 51 and the corresponding pair of data inputs (A, B, C) so that duplicate processing of the data inputs (A, B, C) is avoided accordingly.

In practice, the first OR gate 10 and the first AND gate 12 of FIG. 4, as well as the first OR gate 51 and the respective first AND gate 52 of FIG. 5, can be implemented using CMOS complex gate design. Due to the reduction in fan-ins at the second OR gate 16, 54, the lumped capacitance is reduced to result in a delay much shorter than that in a conventional Earle latch circuit. In summary, through avoidance of duplicate Boolean logic circuits, the feedback latch circuit of this invention has advantages of smaller circuit area, power dissipation and delay as compared to the conventional Earle latch circuit.

Figure 6:
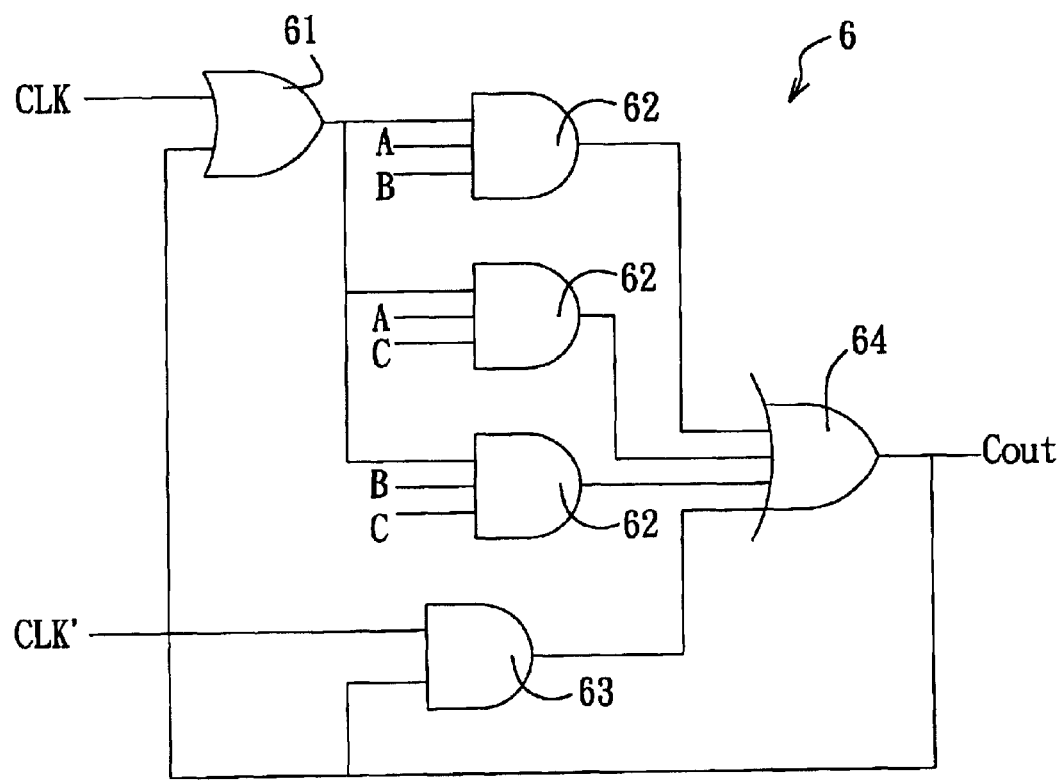
FIG. 6 is a schematic circuit diagram illustrating another circuit application of the feedback latch circuit of FIG. 4.

FIG. 6 is a schematic circuit diagram illustrating another circuit application of the feedback latch circuit of FIG. 4. Unlike the carry circuit 5 of FIG. 5, the latch-incorporating circuit 6 of FIG. 6 includes: a first logic OR gate 61 having a clock input terminal for receiving a clock input signal (CLK), a data input terminal, and an output terminal; a set of first logic AND gates 62, each of which has a first data input terminal coupled to the output terminal of the first logic OR gate 61, a number of data input terminals, each of which receives a respective data input signal (A, B, C), and an output terminal; a second logic AND gate 63 having a data input terminal coupled to the data input terminal of the first logic OR gate 61, a clock input terminal for receiving a complementary clock input signal (CLK') that complements the clock input signal (CLK), and an output terminal; and a second logic OR gate 64 having a set of first data input terminals coupled respectively to the output terminals of the first logic AND gates 62, a second data input terminal coupled to the output terminal of the second logic AND gate 63, and an output terminal coupled to the data input terminals of the first logic OR gate 61 and the second logic AND gate 63. A data output signal (Cout) of the latch-incorporating circuit 6 is likewise obtained from the output terminal of the second logic OR gate 64.

Figure 7:
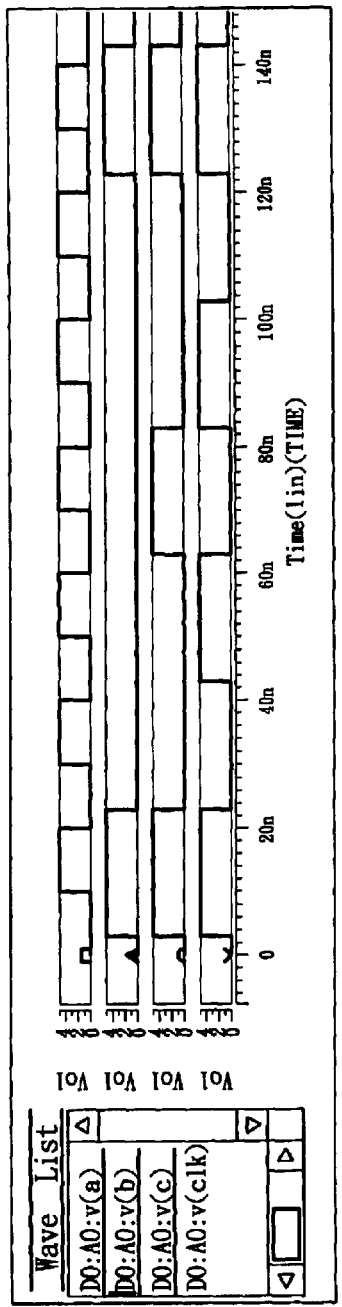
Figure 8:
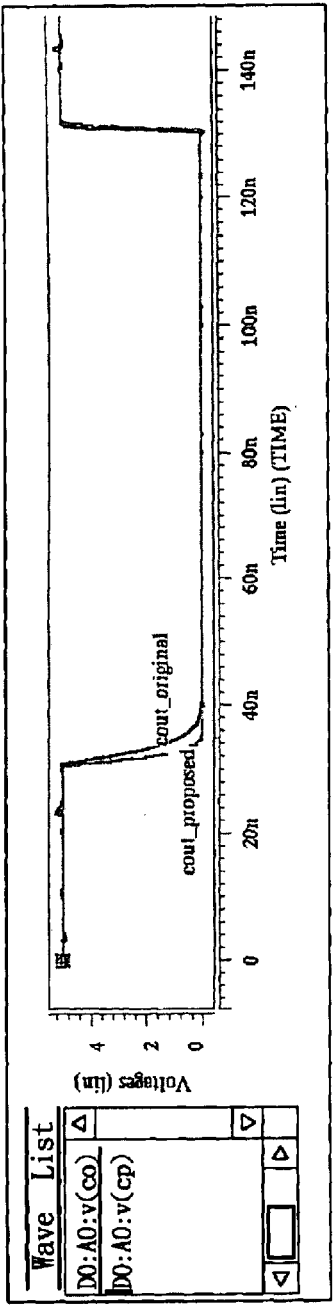
Figure 9:
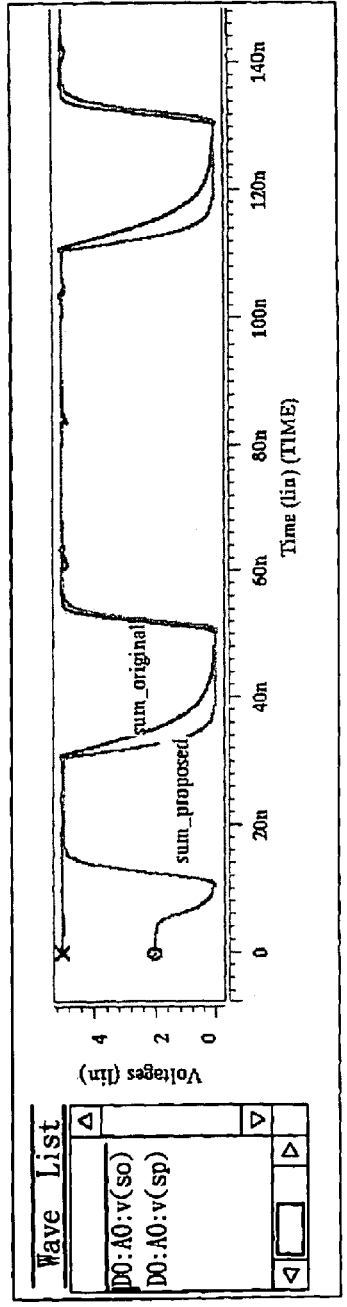

To verify the improved performance of this invention, full-adder carry circuits based on the original Earle latch circuit design and the feedback latch circuit of this invention were implemented by the National Chip Design Center in Taiwan using CMOS 1P3M (a layer of polysilicon and three layers of metal wires) 0.6 $\mu$m technology. Post-layout simulation was then conducted to measure the speeds of the feedback latch circuit of this invention and the original Earle latch circuit. The results are illustrated in FIGS. 7, 8 and 9, wherein FIG. 7 illustrates full-adder input waveforms, FIG. 8 illustrates full-adder carry output waveforms, and FIG. 9 illustrates full-adder sum output waveforms. As evident in FIGS. 8 and 9, the waveforms (e.g., cout_original and sum_original) associated with the conventional Earle latch circuit lag the waveforms (e.g. cout_proposed and sum_proposed) associated with the feedback latch circuit of this invention. The latching speed of the conventional Earle latch circuit was calculated to be about 33 MHz, which is much slower than the calculated latching speed of up to 60 MHZ for the feedback latch circuit of this invention. Moreover, based on actual measurement of layout diagrams, the area of the full-adder carry circuit based on the original Earle latch circuit design is 13458 $\mu$m$^2$, while that of the carry circuit based on the feedback latch circuit of this invention is 12738 $\mu$m$^2$. Therefore, the circuit area utilizing this invention is smaller than that when the original Earle latch circuit is in use, while the speed of the circuit according to this invention is nearly twice as fast as compared to the circuit based on the original Earle latch circuit design.

FIG. 10 is a table to illustrate a comparison among various static latches, including the feedback latch circuit of this invention, a conventional D-latch, a conventional Earle latch circuit, a conventional Jamb latch, a conventional transmission-gate latch, a conventional tri-state buffer latch, and a modified Svensson latch, in a full-adder carry circuit. The data in FIG. 10 was obtained through Hspice simulation. It is evident from FIG. 10 that the circuit area (in terms of transistor count) and power dissipation achieved through the use of this invention are significantly smaller as compared to those attained when the other conventional latch circuits are in use. Although the delay obtained using the circuit of this invention is not the smallest, it is still smaller than that for the conventional Earle latch circuit.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A feedback latch circuit comprising:

a first logic OR gate having a clock input terminal for receiving a clock input signal, a data input terminal, and an output terminal;

a first logic AND gate having a first data input terminal coupled to said output terminal of said first logic OR gate, a second data input terminal for receiving a data input signal, and an output terminal;

a second logic AND gate having a data input terminal coupled to said data input terminal of said first logic OR gate, a clock input terminal for receiving a complementary clock input signal that complements the clock input signal, and an output terminal; and a second logic OR gate having a first data input terminal coupled to said output terminal of said first logic AND gate, a second data input terminal coupled to said output terminal of said second logic AND gate, and an output terminal coupled to said data input terminals of said first logic OR gate and said second logic AND gate;

wherein a latch output of said feedback latch circuit is obtained from said output terminal of said second logic OR gate.

2. A latch-incorporating circuit comprising:

a set of first logic OR gates, each of which has a clock input terminal for receiving a clock input signal, a data input terminal, and an output terminal;

a set of first logic AND gates, each of which has a first data input terminal coupled to said output terminal of a respective one of said first logic OR gates, a number of data input terminals, each of which receives a data input signal, and an output terminal;

a second logic AND gate having a data input terminal coupled to said data input terminal of each of said first logic OR gates, a clock input terminal for receiving a complementary clock input signal that complements the clock input signal, and an output terminal; and a second logic OR gate having a set of first data input terminals coupled respectively to said output terminals of said first logic AND gates, a second data input terminal coupled to said output terminal of said second logic AND gate, and an output terminal coupled to said data input terminals of said first logic OR gates and said second logic AND gate;

wherein a data output signal of said latch-incorporating circuit is obtained from said output terminal of said second logic OR gate.

3. A latch-incorporating circuit comprising:

a first logic OR gate having a clock input terminal for receiving a clock input signal, a data input terminal, and an output terminal;

a set of first logic AND gates, each of which has a first data input terminal coupled to said output terminal of said first logic OR gate, a number of data input terminals, each of which receives a data input signal, and an output terminal;

a second logic AND gate having a data input terminal coupled to said data input terminal of said first logic OR gate, a clock input terminal for receiving a complementary clock input signal that complements the clock input signal, and an output terminal; and a second logic OR gate having a set of first data input terminals coupled respectively to said output terminals of said first logic AND gates, a second data input terminal coupled to said output terminal of said second logic AND gate, and an output terminal coupled to said data input terminals of said first logic OR gate and said second logic AND gate;

wherein a data output signal of said latch-incorporating circuit is obtained from said output terminal of said second logic OR gate.

4. A feedback latch circuit comprising:

a first logic OR gate for performing a logic OR operation upon a clock input signal and a latch output;

a first logic AND gate, coupled to said first logic OR gate, for performing a logic AND operation upon output of said first logic OR gate and a data input signal;

a second logic AND gate for performing a logic AND operation upon a complementary clock input signal and the latch output, the complementary clock input signal complementing the clock input signal; and a second logic OR gate, coupled to said first logic OR gate and said first and second logic AND gates, for performing a logic OR operation upon outputs of said first and second logic AND gates to result in the latch output that is provided to said first logic OR gate and said second logic AND gate.

5. A latch method comprising:

performing a logic OR operation upon a clock input signal and a latch output to obtain a first logic OR output;

performing a logic AND operation upon the first logic OR output and a data input signal to obtain a first logic AND output;

performing a logic AND operation upon a complementary clock input signal and the latch output to obtain a second logic AND output, the complementary clock input signal complementing the clock input signal; and performing a logic OR operation upon the first and second logic AND outputs to result in the latch output.

* * * * *